(12) United States Patent
Yu

(10) Patent No.: US 7,670,869 B2
(45) Date of Patent: Mar. 2, 2010

(54) SEMICONDUCTOR DEVICE AND FABRICATIONS THEREOF

(75) Inventor: Tu-Hao Yu, Hsinchu (TW)

(73) Assignees: Industrial Technology Research Institute, Hsinchu (TW); Powerchip Semiconductor Corp., Hsin-Chu (TW); Nanya Technology Corporation, Kueishan Taoyuan (TW); Promos Technologies Inc., Hsinchu (TW); Windbond Electronics Corp., Hsinchu (TW)

( * ) Notice: Subject to any disclaimer, the term of this patent is extended or adjusted under 35 U.S.C. 154(b) by 0 days.

(21) Appl. No.: 11/976,837

(22) Filed: Oct. 29, 2007

(65) Prior Publication Data

US 2008/0197335 A1   Aug. 21, 2008

(30) Foreign Application Priority Data

Feb. 16, 2007   (TW) .............................. 96106107 A

(51) Int. Cl.
*H01L 21/00* (2006.01)

(52) U.S. Cl. ............................................ 438/95; 257/4
(58) Field of Classification Search .................. 438/95; 257/4
See application file for complete search history.

(56) References Cited

U.S. PATENT DOCUMENTS

| 2004/0043137 | A1* | 3/2004 | Lung ............................ 427/58 |
| 2006/0097239 | A1* | 5/2006 | Hsiung ......................... 257/4 |
| 2006/0278863 | A1 | 12/2006 | Chang et al. |

* cited by examiner

*Primary Examiner*—Thao X Le
*Assistant Examiner*—Kimberly Trice
(74) *Attorney, Agent, or Firm*—Birch, Stewart, Kolasch & Birch, LLP

(57) ABSTRACT

A memory device is disclosed. A pillar structure comprises a first electrode layer, a dielectric layer overlying the first electrode layer, and a second electrode layer overlying the dielectric layer. A phase change layer covers a surrounding of the pillar structure. A bottom electrode electrically connects the first electrode layer of the pillar structure. A top electrode electrically connects the second electrode layer of the pillar structure.

20 Claims, 11 Drawing Sheets

US 7,670,869 B2

SEMICONDUCTOR DEVICE AND FABRICATIONS THEREOF

BACKGROUND OF THE INVENTION

1. Field of the Invention

The invention relates to a memory device and fabrication thereof, and in more particularly to a phase change memory device and a fabrication thereof.

2. Description of the Related Art

Phase change memory devices have many advantages, such as high speed, lower power consumption, high capacity, greater endurance, better process integrity and lower cost. Thus, phase change memory devices can serve as independent or embedded memory devices with high integrity. Due to the described advantages, phase change memory devices can substitute for volatile memory devices, such as SRAM or DRAM, and non-volatile memory devices, such as Flash memory devices.

Phase change memory devices write, read or erase according to different resistance of a phase change material between crystal state and non-crystal state. For example, a phase change layer is applied with a relative high current and short pulse, such as 1 mA with 50 ns, to change from a crystal state to a non-crystal state. Because the non-crystal state phase change layer has higher resistance, such as 105 ohm, the phase change memory device presents a smaller current when applied with a voltage to read. When erasing, the phase change layer is applied with a low current, such as 0.2 mA, for a longer duration, such as 100 ns, to change from a non-crystal state to a crystal state. Since the crystal state phase change layer has lower resistance, such as 103-104 ohm, the phase change memory device presents a higher current when applied with a voltage to read. The phase change memory device operates according the mechanism described.

FIG. 1 shows a conventional T shaped phase change memory device. Referring to FIG. 1, a conventional T-shaped phase change memory device sequentially comprises a bottom electrode 102, a heating electrode 104, a phase change layer 106 and a top electrode 108, wherein the columnar heating electrode 104 connects the phase change layer 106. In a standard phase change memory device, current is determined according to a contact area between an electrode and a phase change layer thereof. In the conventional T shaped phase change memory device, the contact area between the heating electrode 104 and the phase change layer 106 is determined by limits of photolithography, rendering reduction of dimension difficult.

FIG. 2 shows another conventional phase change memory device, in which a heating electrode 202 is disposed horizontally. As shown in FIG. 2, a planar heating electrode 202 is formed on a bottom electrode 204 and an inter-layer dielectric layer 206. The planar heating electrode 202 is patterned in a first direction by lithography, and a phase change layer 208 is then formed to contact the patterned planar heating electrode 202. Thereafter, the phase change layer 208 is patterned in a second direction by lithography to define memory cells of the memory device. Next, a top electrode 210 is formed, electrically connecting the phase change layer 208. In the memory device, the heating electrode 202 is disposed horizontally, and the size of the contact area between the heating electrode 202 and the phase change layer 208 is determined by thickness of the heating electrode 202, which is not limited by lithography. Phase change layer 208 of the phase change memory device, however, is formed by gap filling, negatively affecting endurance and uniformity of contact between the phase change layer 208 and the heating electrode 202 of the phase change memory device.

BRIEF SUMMARY OF THE INVENTION

A detailed description is given in the following embodiments with reference to the accompanying drawings. These and other problems are generally solved or circumvented, and technical advantages are generally achieved, by the invention.

The invention provides a method for forming a memory device. A first inter-layer dielectric layer is formed on a substrate. A bottom electrode is formed in the inter-layer dielectric layer. A first electrode layer is formed on the first inter-layer dielectric layer and the bottom electrode. A dielectric layer is formed on the first electrode layer. A second electrode layer is formed on the dielectric layer. The first electrode layer, the dielectric layer and the second electrode layer are patterned to form a pillar structure, corresponding to a memory cell of the memory device. A phase change layer is formed on the pillar structure and the substrate. The phase change layer is patterned to separate the patterned phase change layer of the memory cell from another patterned phase change layer of an adjacent memory cell. A top electrode is formed to at least electrically connect the second electrode layer of the pillar structure.

The invention provides a memory device. A pillar structure comprises a first electrode layer, a dielectric layer overlying the first electrode layer, and a second electrode layer overlying the dielectric layer. A phase change layer covers a surrounding of the pillar structure. A bottom electrode electrically connects the first electrode layer of the pillar structure. A top electrode electrically connects the second electrode layer of the pillar structure.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
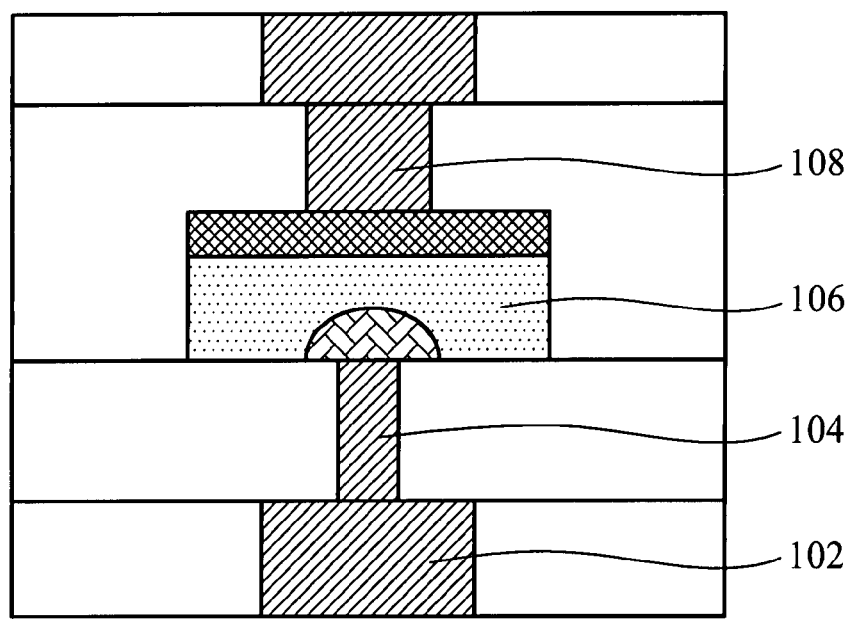
FIG. 1 shows a conventional T shaped phase change memory device.
Figure 2:
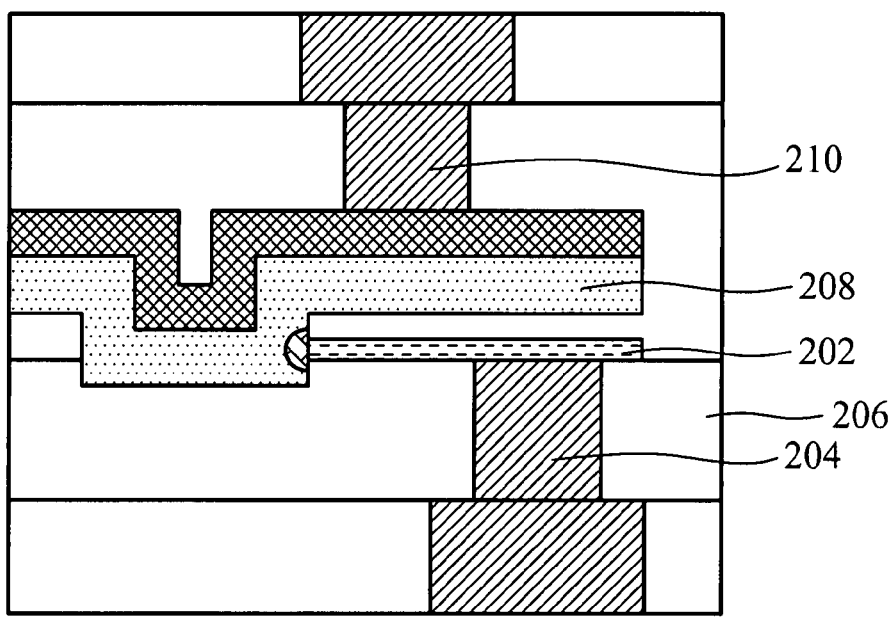
FIG. 2 shows another conventional phase change memory device.

The following description is of the best-contemplated mode of carrying out the invention. This description is made for the purpose of illustrating the general principles of the invention and should not be taken in a limiting sense. The scope of the invention is best determined by reference to the appended claims. Embodiments of the invention are described with reference to the drawings that accompany the invention. It is noted that in the accompanying drawings, like and/or corresponding elements are referred to by like reference numerals. The invention is not limited to any particular fluid driving device or driving method, which is not particularly mentioned in the specification.

Figure 3A:
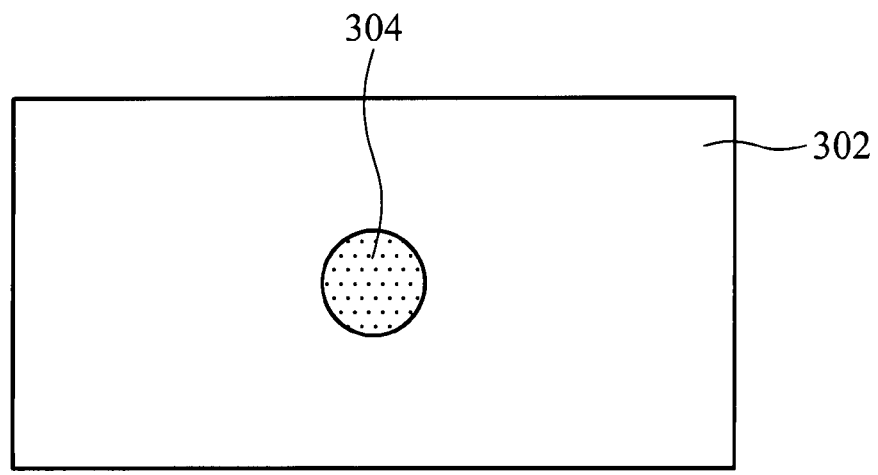
FIG. 3A shows a top view of an intermediate stage of a method for forming a phase change memory device of an embodiment of the invention.
Figure 3B:
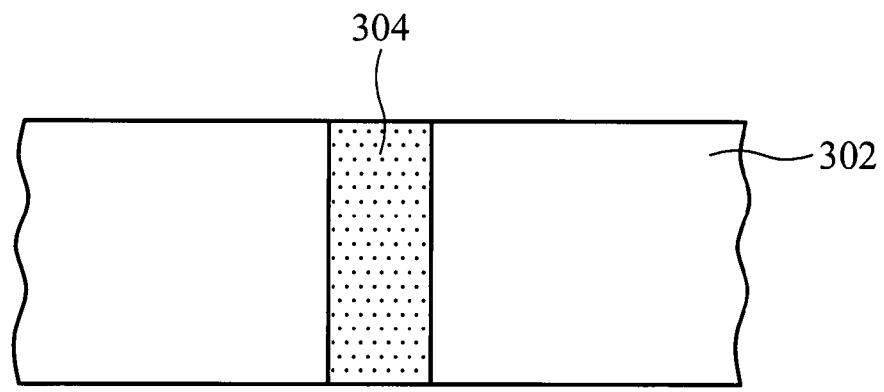
FIG. 3B is a cross section of FIG. 3A.

FIGS. 3A-10B illustrate a method for forming a phase change memory device of an embodiment of the invention. Referring to FIG. 3A and FIG. 3B, in which FIG. 3A is a top view of FIG. 3B, a substrate comprising necessary elements is provided. The elements can be gates, dielectric layers and/or conductive vias, but the substrate, elements thereon or fabrications thereof are known in the art, which are not shown in the figures for simplicity. Next, a first inert layer dielectric layer 302 and a bottom electrode 304 are formed on the dielectric layer and/or the conductive via (not shown) over the substrate. The first inert layer dielectric layer 302 can be silicon oxide, silicon nitride, silicon oxynitride or low k dielectric materials. The bottom electrode 304 can comprise low conductivity materials, such as aluminum, cupper or tungsten. The formation of the bottom electrodes 304 can comprise forming openings in the first inert layer dielectric layer 302 by lithography and etching, and filling the openings with conductive materials. Alternatively, the bottom electrodes 304 can be formed by patterning a conductive layer, blankety depositing a first inert layer dielectric layer 302, and then etching back the first inert layer dielectric layer 302.

Figure 4A:
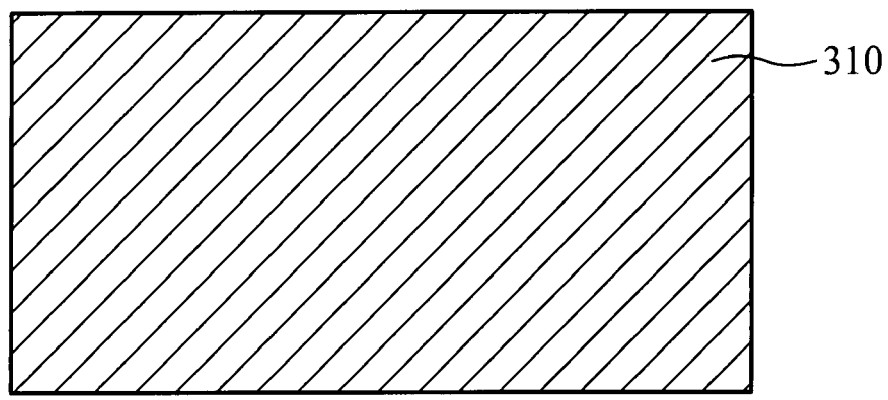
FIG. 4A shows a top view of an intermediate stage of a method for forming a phase change memory device of an embodiment of the invention.
Figure 4B:
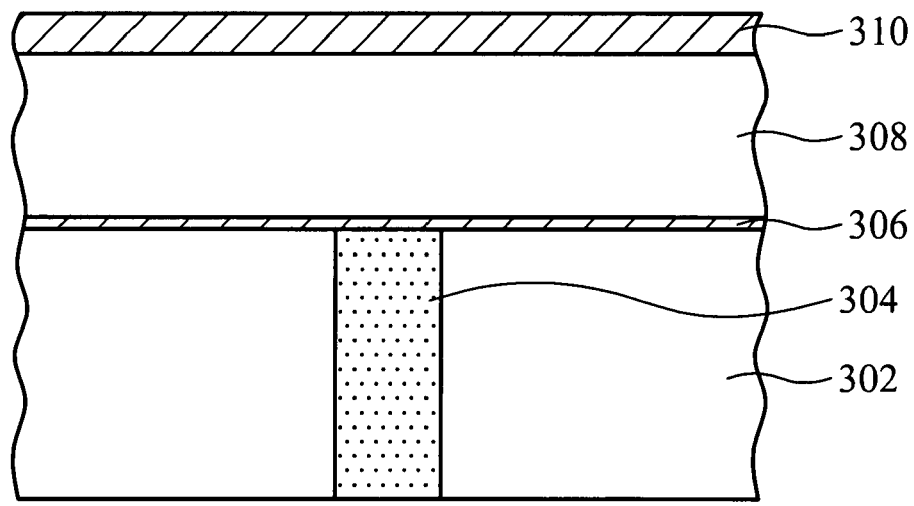
FIG. 4B is a cross section of FIG. 4A.

Next, referring to FIG. 4A and FIG. 4B, in which FIG. 4A is a top view of FIG. 4B, a first electrode layer 306 is formed on the bottom electrode 304 and the first inter-layer dielectric layer 302 by physical vapor deposition, PVD or atomic layer deposition, ALD. The first electrode layer 306 can be TiN, TiW or TiAlN. Note that the first electrode layer 306 cannot be too thick, which is preferably about 5 Å-500 Å, and more preferably about 100 Å-300 Å. Next, a dielectric layer 308 is formed on the first electrode layer 306 by low pressure chemical vapor deposition (LPCVD), atmosphere pressure chemical vapor deposition (APCVD), sub-atmospheric chemical vapor deposition (SACVD), plasma enhanced chemical vapor deposition (PECVD) or other depositing methods. The dielectric layer 308 can be silicon oxide, silicon nitride, silicon oxynitride or the like. Thereafter, a second electrode layer 310 is formed on the dielectric layer 308 by physical vapor deposition, PVD or atomic layer deposition, ALD. The second electrode layer 310 can be TiN, TiW, TiAl, TaN or TiAlN.

In a preferred embodiment of the invention, the second electrode layer 310 is thicker than the first electrode layer 306. For example, the second electrode layer is twice or triple thickness that of the first electrode layer, in which the second electrode layer can be about 100 Å-3000 Å thick.

Figure 5A:
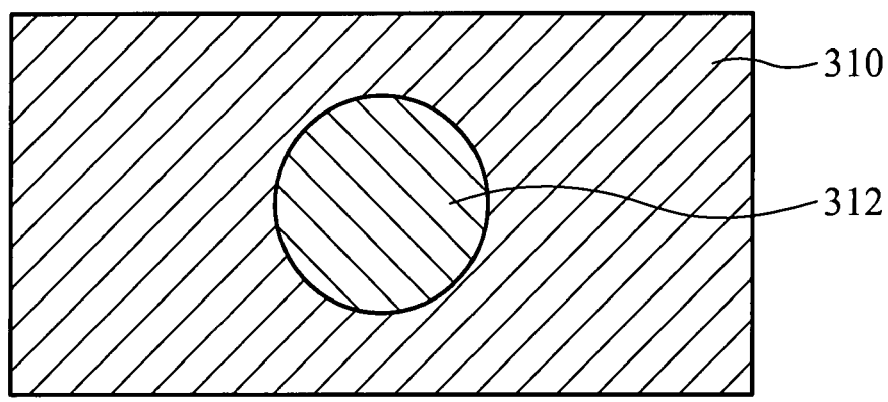
FIG. 5A shows a top view of an intermediate stage of a method for forming a phase change memory device of an embodiment of the invention.
Figure 5B:
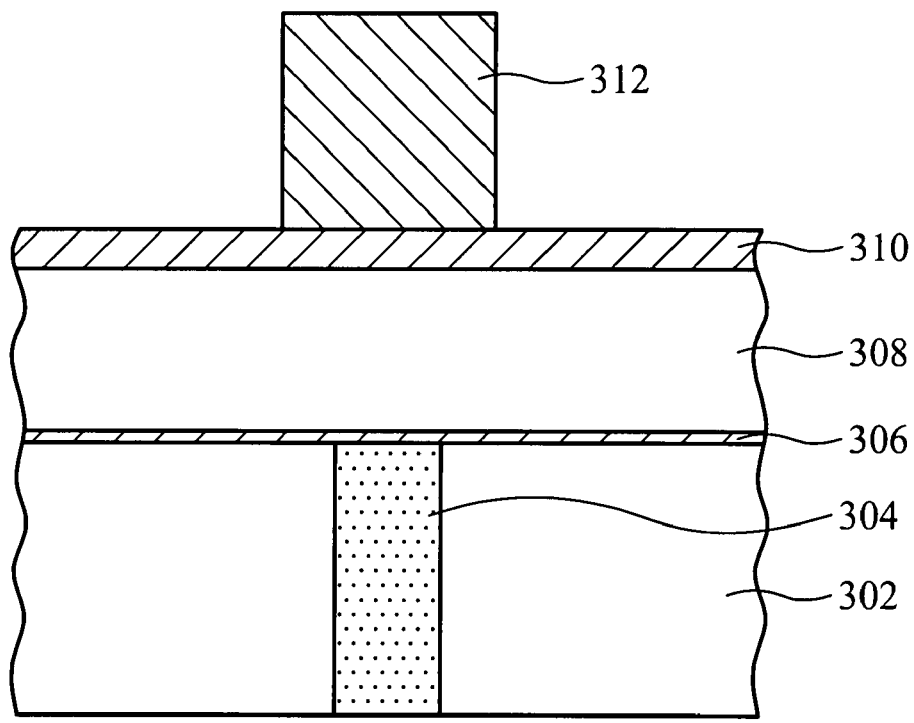
FIG. 5B is a cross section of FIG. 5A.

Referring to FIG. 5A and FIG. 5B, a resist layer (not shown) is formed on the second electrode layer 310 by a coating method, such as spin coating. Next, the resist layer is defined by lithography to form a patterned resist layer 312 according to predetermined design.

Figure 6A:
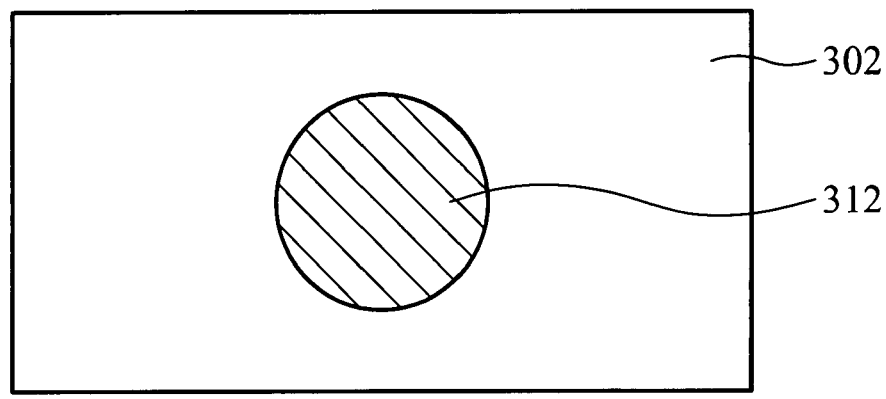
FIG. 6A shows a top view of an intermediate stage of a method for forming a phase change memory device of an embodiment of the invention.
Figure 6B:
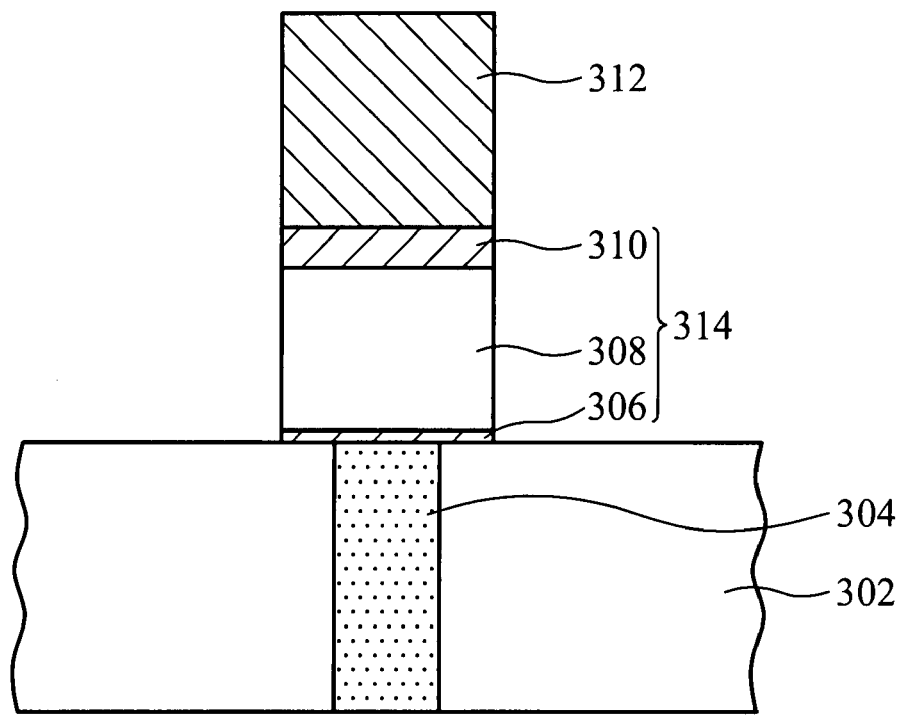
FIG. 6B is a cross section of FIG. 6A.

Referring to FIG. 6A and FIG. 6B, the second electrode layer 310, the dielectric layer 308 and the first electrode layer 306 are sequentially and anisotropically etched to form a pillar structure 314 with closed surroundings using the patterned resist layer 312 as a mask. Thereafter, the patterned resist layer 312 is removed. The pillar structure 314 is preferably column-shaped, but the invention is not limited thereto. The pillar structure 314 can be any closed-shaped structure, such an oval-shaped pillar or a square, etc. Note that the pillar structure 314 with a closed surrounding corresponds to a single memory cell of the memory device of an embodiment of the invention.

Figure 7A:
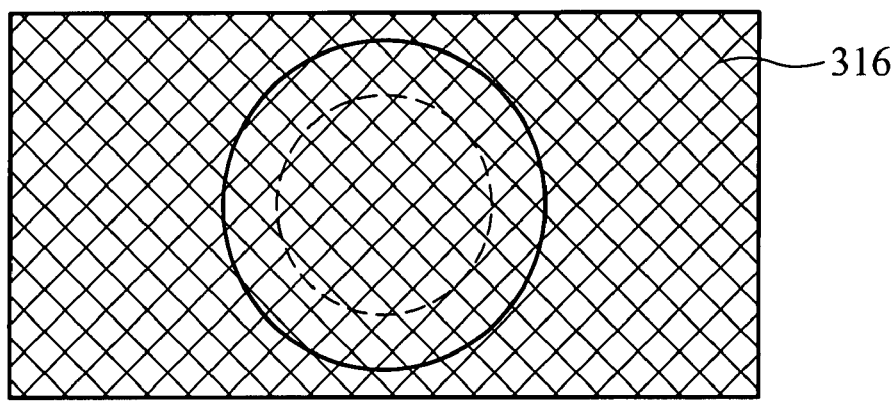
FIG. 7A shows a top view of an intermediate stage of a method for forming a phase change memory device of an embodiment of the invention.
Figure 7B:
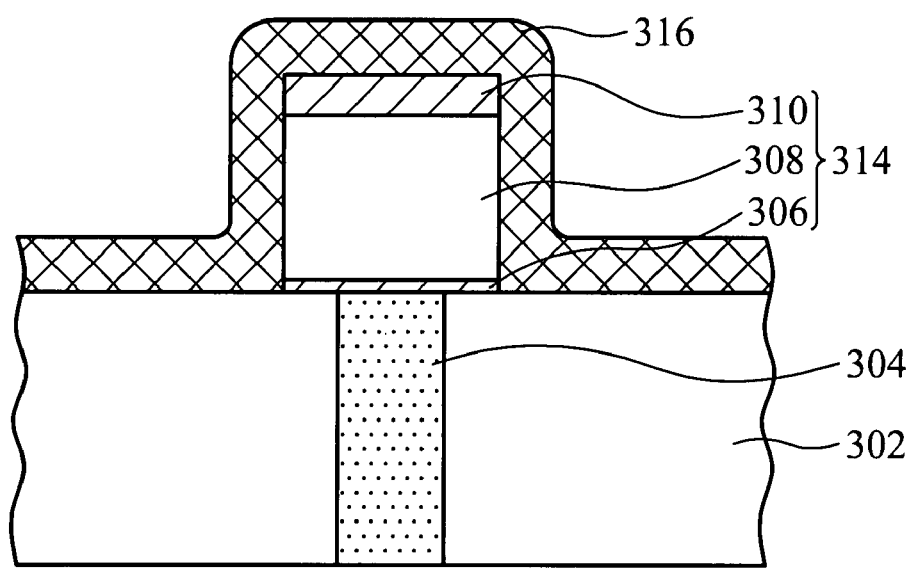
FIG. 7B is a cross section of FIG. 7A.

Referring to FIG. 7A and FIG. 7B, a phase change layer 316 is formed on the first inter-layer dielectric layer 302 and top and sidewalls of the pillar structure 314 by physical vapor deposition (PVD) or atomic layer deposition (ALD). The phase change layer 316 can be Ag, In, Te, Sb or combinations thereof, or Ge, Te, Sb or combinations thereof. In a preferred embodiment of the invention, the phase change layer 316 is $Ag_xIn_yTe_zSb_w$ or $Ge_xTe_ySb_w$, and about 500 Å thick. Note that the phase change layer 316 directly contacts the surrounding of the pillar structure 314. Specifically, the phase change layer 316 directly contacts the surrounding of the first electrode layer 306 of the pillar structure 314.

Figure 8A:
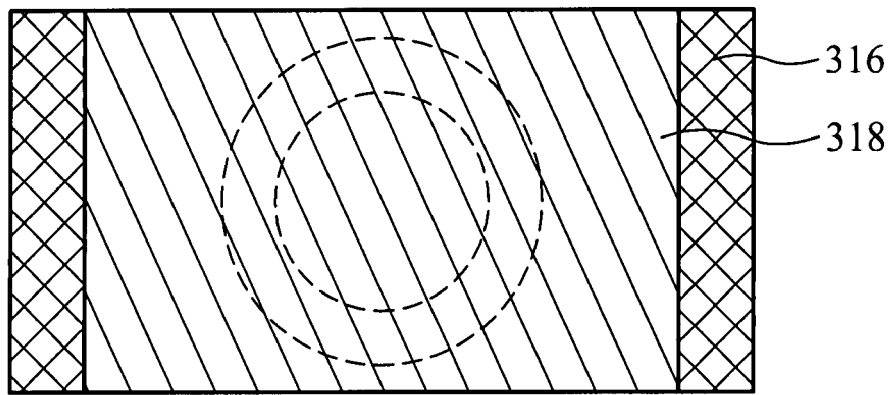
FIG. 8A shows a top view of an intermediate stage of a method for forming a phase change memory device of an embodiment of the invention.
Figure 8B:
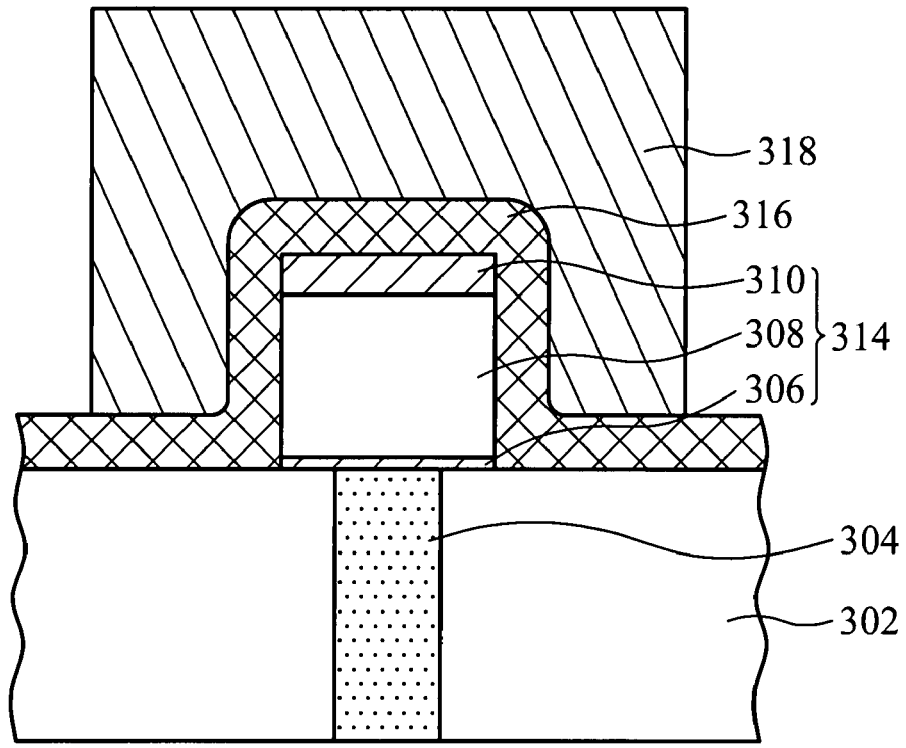
FIG. 8B is a cross section of FIG. 8A.

Referring to FIG. 8A and FIG. 8B, a resist layer (not shown) is formed on the phase change layer 316, and then defined by lithography to form a patterned resist layer 318.

Figure 9A:
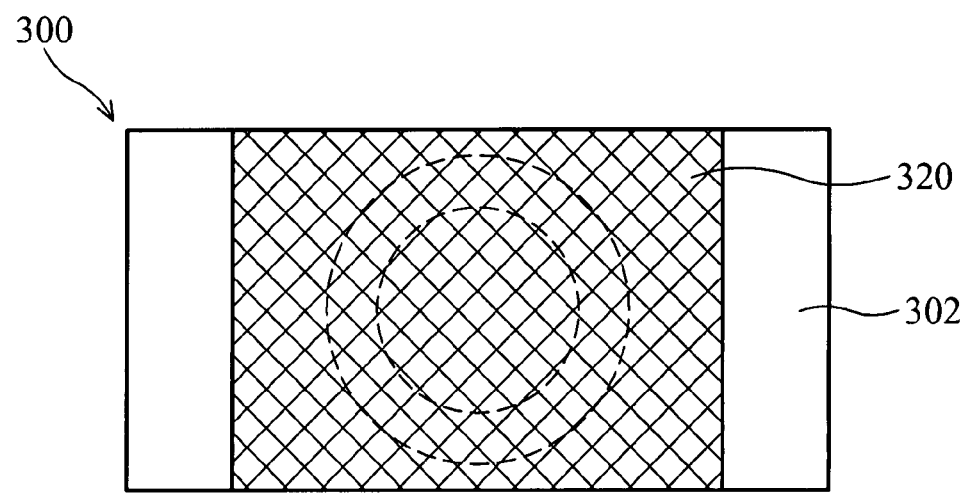
FIG. 9A shows a top view of an intermediate stage of a method for forming a phase change memory device of an embodiment of the invention.
Figure 9B:
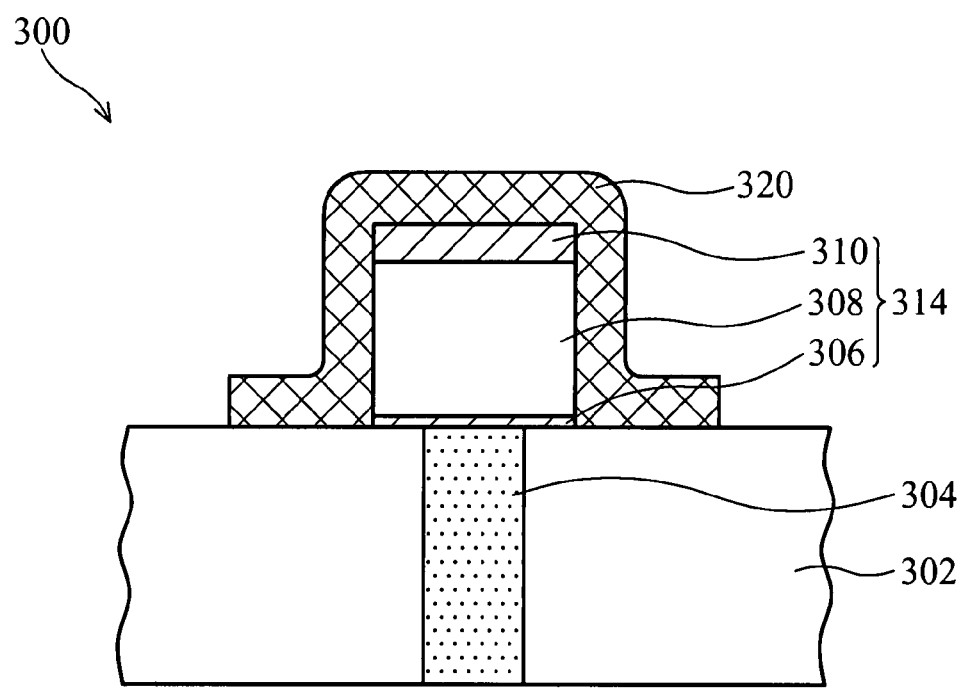
FIG. 9B is a cross section of FIG. 9A.
Figure 9C:
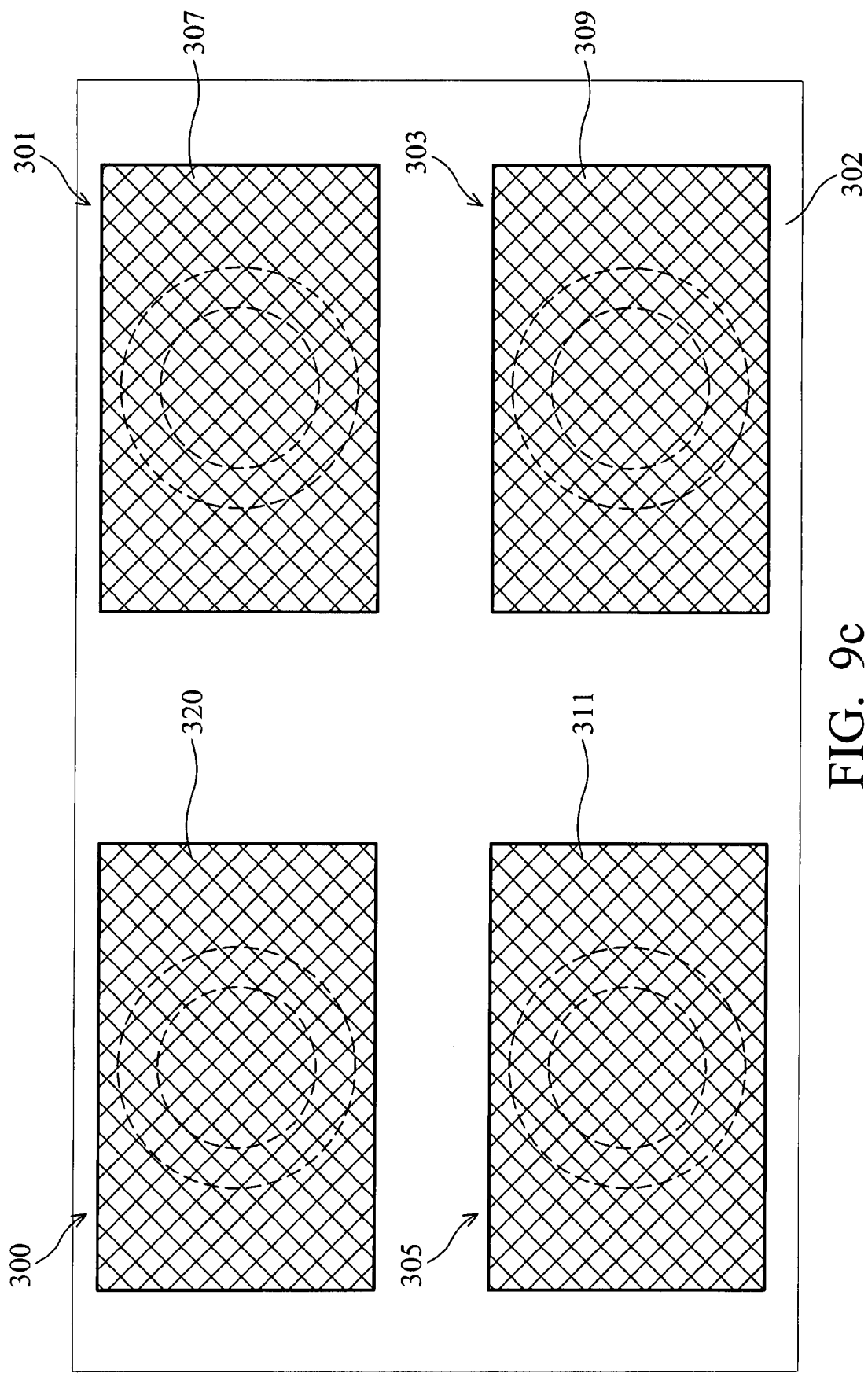
FIG. 9C show a top view of a memory device comprising a plurality of memory cells.

Referring to FIG. 9A, FIG. 9B and FIG. 9C, the phase change layer 316 is etched using the patterned resist layer 318 as a mask to form a patterned phase change layer 320 of the memory cell 300, which is separated from other patterned phase change layers 307, 309, 311 of adjacent memory cells 301, 303, 305.

Figure 10A:
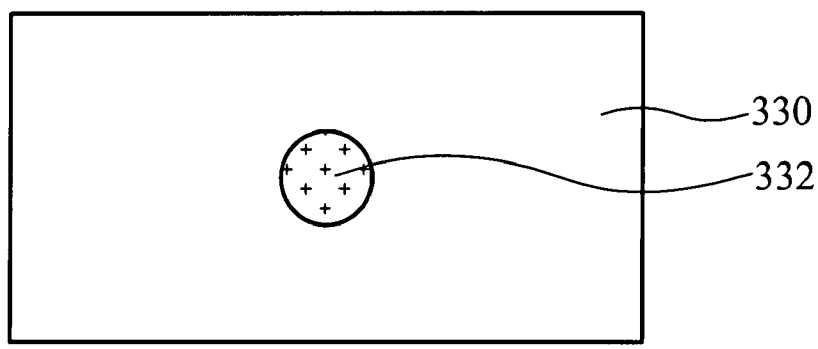
FIG. 10A shows a top view of an intermediate stage of a method for forming a phase change memory device of an embodiment of the invention.
Figure 10B:
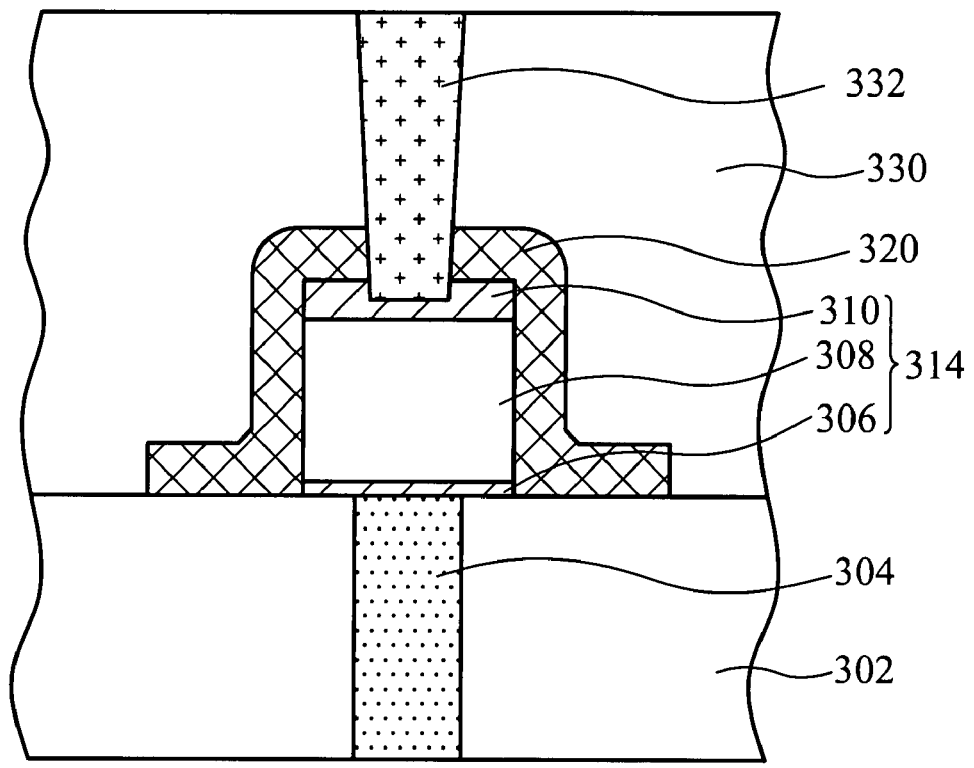
FIG. 10B is a cross section of FIG. 10A.

Referring to FIG. 10A and FIG. 10B, a second inter-layer dielectric layer 330 is formed to cover the patterned phase change layer 320 and the first inter-layer dielectric layer 302 by a depositing method, such as chemical vapor deposition. The second inter-layer dielectric layer 330 can be silicon oxide, silicon nitride or silicon oxynitride. Next, the second inter-layer dielectric layer 330 is polished. Thereafter, the second inter-layer dielectric layer 330 and the patterned phase change layer 316 are patterned to form an opening, exposing the second electrode layer 310. Next, a conductive layer, such as Al, Cu or W is deposited on the second inter-layer dielectric layer 330 and fills the opening to form a top electrode 332, electrically connecting the second electrode layer 310 of the pillar structure 314.

Figure 11:
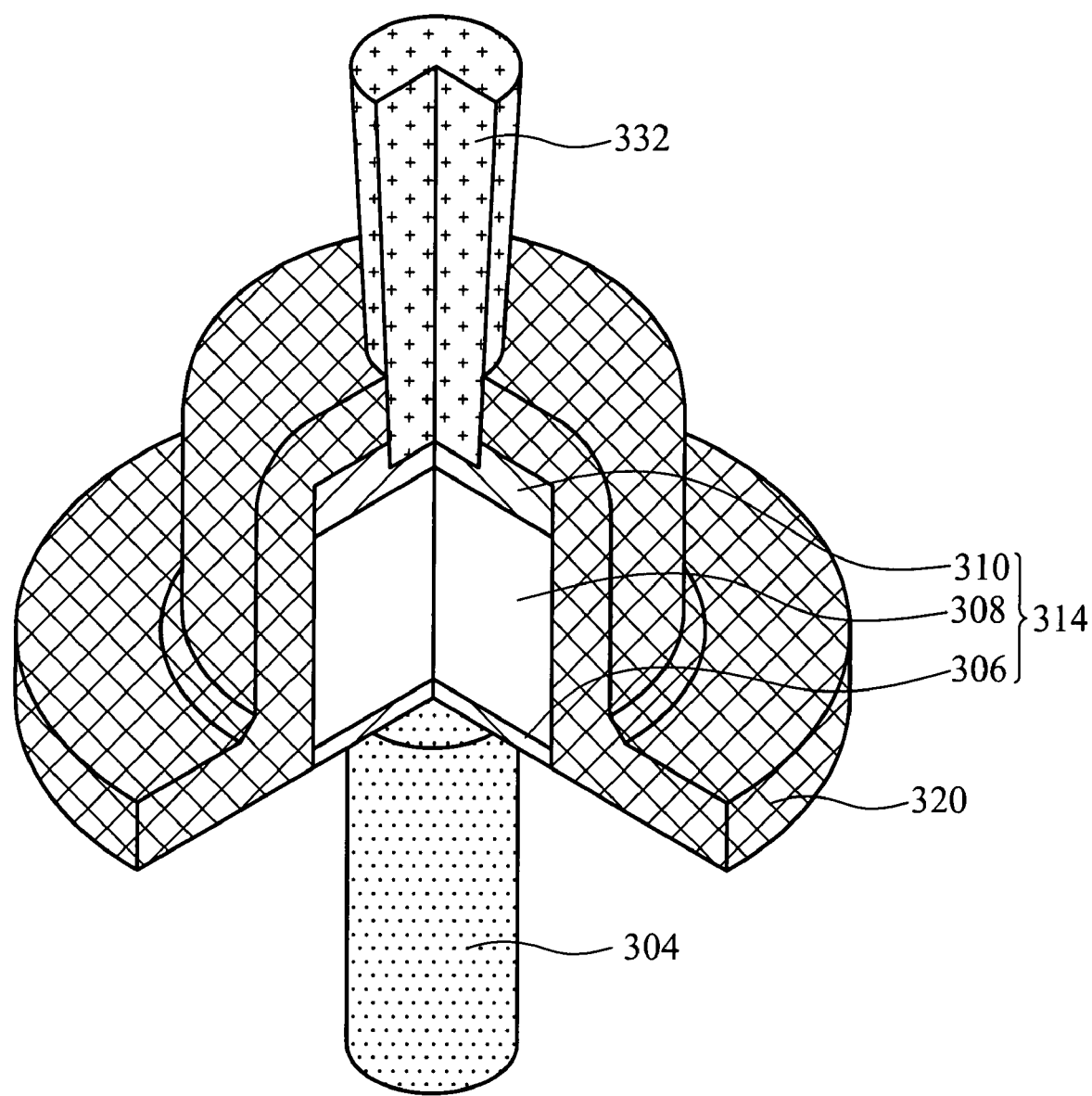
FIG. 11 shows a three dimensional view of a memory cell of an embodiment of the invention.

FIG. 11 shows a three dimensional view of a memory cell of an embodiment of the invention, explaining the structure more detail. In this embodiment, a major portion of the memory cell is the pillar structure 314, comprising a first electrode layer 306, a dielectric layer 308 and a second electrode layer 310. The pillar structure 314 is covered by the patterned phase change layer 320. In addition, the first electrode layer 306 and the second electrode layer 310 of pillar structure 314 electrically connect the top electrode 332 and the bottom electrode 304 respectively.

According to the embodiments described, because the first electrode layer 306 of the pillar structure 314 is much thicker than the second electrode layer 310, the first electrode layer has higher resistance. Therefore, heat generated from passage of current mainly neighbors the first electrode layer 306. When the pillar structure 314 is column-shaped, the interface between the first electrode layer 306 (heating electrode) and the phase change layer 320 forms a ring. For example, the columnar structure 314 has a diameter cd and a thickness t. The area A of the interface between the heating electrode 306 and the phase change layer 320 is equal to $cd \times \pi \times t$. Note that the area A is not limited to lithography process. In addition, only one lithography step is required to determining the contact area between the heating electrode 306 and the phase change layer 320 of a phase change memory device of the embodiment of the invention. Accordingly, variations and/or affection generated from lithography steps can be reduced. Additionally, the phase change layer 320 is not further processed or modified, for example by heating, thus composition change could be reduced. Furthermore, in an embodiment of the invention, because the heating electrode (first electrode layer 306) is formed on a plane, it is more easily fabricated than conventional technology.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a memory device, comprising:
   providing a substrate;
   forming a first inter-layer dielectric layer on the substrate;
   forming a bottom electrode in the inter-layer dielectric layer;
   forming a first electrode layer on the first inter-layer dielectric layer and the bottom electrode;
   forming a dielectric layer on the first electrode layer;
   forming a second electrode layer on the dielectric layer;
   patterning the first electrode layer, the dielectric layer and the second electrode layer to form a pillar structure, corresponding to a memory cell of the memory device;
   forming a phase change layer on the pillar structure and the substrate;
   patterning the phase change layer to separate the patterned phase change layer of the memory cell from another patterned phase change layer of an adjacent memory cell, wherein the patterned phase change layer covers a surrounding of the pillar structure; and
   forming a top electrode, electrically connecting the second electrode layer of the pillar structure through the patterned phase change layer covering the surrounding of the pillar structure, wherein the pillar structure is column-shaped and wherein an interface between the first electrode layer and the phase change layer is ring-shaped.

2. The method for forming a memory device as claimed in claim 1, wherein the pillar structure has a closed surrounding.

3. The method for forming a memory device as claimed in claim 1, wherein the phase change layer substantially directly contacts a surrounding of the pillar structure.

4. The method for forming a memory device as claimed in claim 3, wherein the phase change layer directly contacts a surrounding of the first electrode layer of the pillar structure.

5. The method for forming a memory device as claimed in claim 1, wherein the first electrode layer is thinner than the second electrode layer.

6. The method for forming a memory device as claimed in claim 1, wherein the first electrode layer comprises TiN, TiW or TiAlN.

7. The method for forming a memory device as claimed in claim 1, wherein the second electrode layer comprises TiN, TiW, TiAl, TaN or TiAlN.

8. The method for forming a memory device as claimed in claim 1, wherein the phase change layer comprises Ag, In, Te, Sb or combinations thereof, or Ge, Te, Sb or combinations thereof.

9. The method for forming a memory device as claimed in claim 1, wherein the dielectric layer comprises silicon oxide, silicon nitride or silicon oxynitride.

10. The method for forming a memory device as claimed in claim 1, wherein the bottom electrode and the top electrode comprise Al, Cu or W.

11. A memory device, comprising:
    a pillar structure, comprising a first electrode layer, a dielectric layer overlying the first electrode layer and a second electrode layer overlying the dielectric layer;
    a phase change layer covering a surrounding of the pillar structure;
    a bottom electrode electrically connecting the first electrode layer of the pillar structure; and
    a top electrode electrically connecting the second electrode layer of the pillar structure, wherein the pillar structure is column-shaped and wherein an interface between the first electrode layer and the phase change layer is ring-shaped.

12. The method for forming a memory device as claimed in claim 11, wherein the pillar structure has a closed surrounding.

13. The method for forming a memory device as claimed in claim 12, wherein the phase change layer substantially directly contacts the surrounding of the pillar structure.

14. The memory device as claimed in claim 11, wherein the phase change layer directly contacts a surrounding of the first electrode layer of the pillar structure.

15. The memory device as claimed in claim 11, wherein the first electrode layer is thinner than the second electrode layer.

16. The memory device as claimed in claim 11, wherein the first electrode layer comprises TiN, TiW or TiAlN.

17. The memory device as claimed in claim 11, wherein the second electrode layer comprises TiN, TiW, TiAl, TaN or TiAlN.

18. The memory device as claimed in claim 11, wherein the phase change layer comprises Ag, In, Te, Sb or combinations thereof, or Ge, Te, Sb or combinations thereof.

19. The memory device as claimed in claim 11, wherein the dielectric layer comprises silicon oxide, silicon nitride or silicon oxynitride.

20. The memory device as claimed in claim 11, wherein the bottom electrode and the top electrode comprise Al, Cu or W.

* * * * *